United States Patent
Yamaguchi et al.

(10) Patent No.: US 7,126,090 B2
(45) Date of Patent: Oct. 24, 2006

(54) CERAMIC HEATERS, A METHOD FOR PRODUCING THE SAME AND ARTICLES HAVING METAL MEMBERS

(75) Inventors: Shinji Yamaguchi, Ama-gun (JP); Kazuhiro Nobori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 17 days.

(21) Appl. No.: 10/387,875

(22) Filed: Mar. 13, 2003

(65) Prior Publication Data

US 2003/0183615 A1 Oct. 2, 2003

(30) Foreign Application Priority Data

Mar. 27, 2002 (JP) .............................. 2002-088585

(51) Int. Cl.
*H05B 3/68* (2006.01)
*H05B 3/00* (2006.01)
(52) U.S. Cl. ...................... 219/444.1; 118/724; 29/611
(58) Field of Classification Search ............. 219/443.1, 219/444.1, 465.1, 466.1, 543, 544, 546, 547, 219/548; 118/427, 725; 29/610.1, 611, 616, 29/617, 620
See application file for complete search history.

(56) References Cited

U.S. PATENT DOCUMENTS

| | | | | |
|---|---|---|---|---|
| 5,683,606 A | * | 11/1997 | Ushikoshi et al. | 219/544 |
| 6,051,303 A | * | 4/2000 | Katsuda et al. | 428/138 |
| 6,080,970 A | * | 6/2000 | Yoshida et al. | 219/444.1 |
| 6,133,557 A | * | 10/2000 | Kawanabe et al. | 219/544 |
| 6,204,489 B1 | * | 3/2001 | Katsuda et al. | 219/544 |

FOREIGN PATENT DOCUMENTS

| | | |
|---|---|---|
| JP | 11-251039 | 9/1999 |
| JP | 2000-068038 | 3/2000 |

\* cited by examiner

*Primary Examiner*—Sang Paik
(74) *Attorney, Agent, or Firm*—Burr & Brown

(57) ABSTRACT

A ceramic heater is provided including a ceramic sintered body and a heat resistor embedded in the substrate, wherein a change in the temperature uniformity on the heating face is reduced. The heat resistor contains a metal comprising one or more metal elements selected from the group consisting of Group IVa, Group Va and Group VIa elements of the Periodic Table and a carbide of the metal. A ratio (Ic/Im) of a total strength (Ic) of main peak of the metal carbide to a total strength (Im) of main peak strength of the metal is not larger than 0.2. Alternatively, the ratio (Rb–Ra)/Ra is not larger than 30 percent, where "Ra" is the resistance of the heat resistor before sintering and "Rb" is the resistance of the heat resistor after sintering.

14 Claims, 5 Drawing Sheets

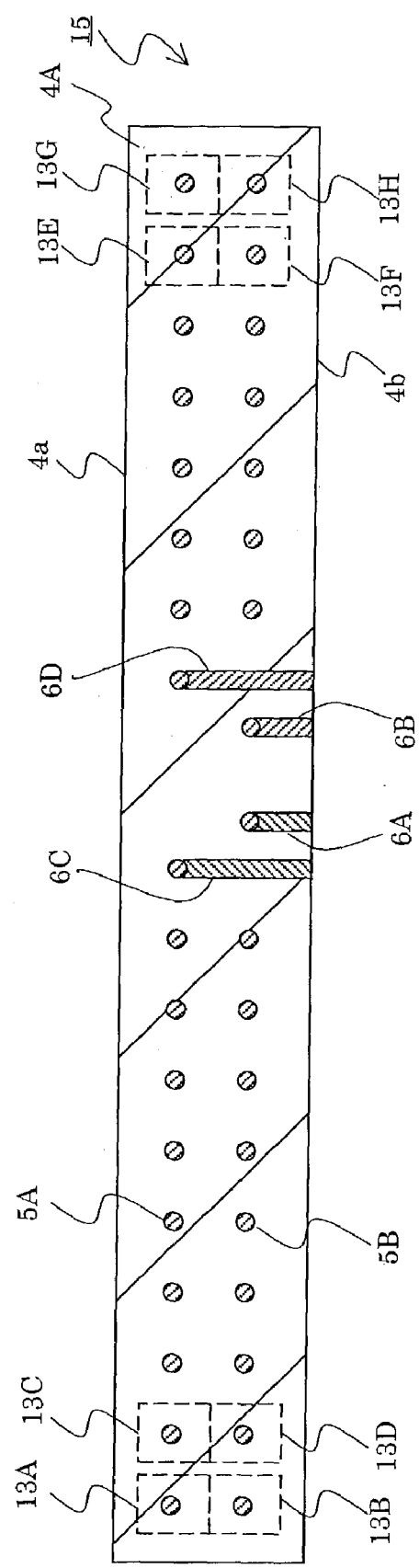

US 7,126,090 B2

CERAMIC HEATERS, A METHOD FOR PRODUCING THE SAME AND ARTICLES HAVING METAL MEMBERS

This application claims the benefits of Japanese Patent Application P2002-88585 filed on Mar. 27, 2002, the entirety of which is incorporated by reference.

BACKGROUND OF THE INVENTION

1. Field of the Invention

The invention relates to a ceramic heater, a method of producing the same and an article having a metal member.

2. Related Art Statement

In a semiconductor producing system, ceramic heaters have been applied to heat a wafer so as to deposit a semiconductor thin film on the wafer from gaseous raw materials such as silane gas by means of thermal CVD or the like. For example, Japanese Patent publication P2000-68, 038A disclosed this kind of ceramic heater. The heater has a substrate made of a nitride ceramics and a heat resistor made of, for example, tungsten. A tungsten silicide and tungsten carbide layers are formed in the heat resistor during the sintering process of the ceramic substrate.

Japanese Patent publication 11-251, 039A discloses a heater having a substrate made of aluminum nitride ceramics and a heat resistor embedded therein. In the heater, the resistor is composed of, for example, tungsten and tungsten carbide. Further in the heater, a ratio (I2/I1) of a main peak strength of tungsten (I1) to that of tungsten carbide (I2) is adjusted to a value between 0.9 to 6.0. It is thus made possible to reduce the resistance-temperature system.

SUMMARY OF THE INVENTION

The inventors have studied a method of mass production of a ceramic heater having an aluminum nitride sintered body and a heat resistor of molybdenum or tungsten embedded in the body. For example in a ceramic heater for use in a system for producing semiconductors, it is necessary to elevate the temperature on a heating face of a semiconductor wafer at a high temperature such as 750° C. It is also indispensable to control the temperature distribution on the heating face for the wafer within an extremely narrow temperature range. In the mass production procedure, the surface of the sintered body is processed to form the heating face for the semiconductor wafer, and the temperature distribution (a difference between the maximum and minimum temperatures) on the heating face is then measured. When the temperature difference is out of a specification, the heater is treated as an off-specification product.

The uniformity of temperature on the heating face of the ceramic heater is depended on several factors such as the dimensional precision of the ceramic substrate, uniformity of the shape of the substrate, and state of the embedded heat resistor (particularly the density). The state of the embedded heat resistor is particularly important. For example when a heat resistor composed of a wire is embedded in the ceramic substrate, it is important to control the winding number, geometrical shape and three dimensional position of the wire in the substrate.

The inventors have studied such factors and successfully taken substantial steps for providing a solution by strictly controlling the above factors. Even in this case, however, it is proved that the uniformity of temperature on the heating face may be deteriorated to result in the generation of off-specification products in an actual mass production process. That is, the difference of the maximum and minimum temperatures on the heating face may be changed among manufactured products. It is considered that the reaction or denaturation of the heat resistor in the ceramic substrate results in the deviation of the temperature difference.

An object of the present invention is to provide a ceramic heater having a ceramic sintered body and a heat resistor embedded in the substrate, in which the change of the uniformity of temperature on the heating face may be reduced among heaters actually fabricated.

Another object of the present invention is to provide an article having a ceramic sintered body and a metal member contacted with the sintered body, in which a reaction of the metal member is prevented, or a degree of the progress of a reaction of a metal member is made constant, during the sintering process of the sintered body.

The present invention provide a ceramic heater having a ceramic sintered body and a heat resistor contacted with the sintered body. The heat resistor contains a metal comprising one or more metal element selected from the group consisting of IVa, Va and VIa elements of the Periodic Table and a carbide of the metal. Further, a ratio (Ic/Im) of a total (Ic) of a main peak strength of the metal carbide to a total (Im) of a main peak strength of the metal is not larger than 0.2, measured by means of an X-ray diffraction method.

The present invention further provides a ceramic heater having a ceramic sintered body and a heat resistor contacted with the sintered body. The sintered body is produced by sintering a shaped body of ceramic powder contacted with the heat resistor. Further, (Rb−Ra)/Ra is not larger than 30 percent, where "Ra" is a resistance of the heat resistor before the sintering and "Rb" is a resistance of the heat resistor after the sintering.

The present invention still further provides a ceramic heater having a ceramic sintered body and a heat resistor contacted with the sintered body. The sintered body is produced by sintering a shaped body of ceramic powder contacted with the heat resistor and a dummy member composed of a metal comprising one or more metal element selected from the group consisting of IVa, Va and VIa elements of the Periodic Table.

The present invention still further provides a method of producing a ceramic heater comprising a ceramic sintered body and a heat resistor contacted with the sintered body. According to the method, a shaped body of ceramic powder is contacted with the heat resistor and a dummy member containing a metal comprising one or more metal element selected from the group consisting of IVa, Va and VIa elements of the Periodic Table, and the shaped body is then sintered to provide the sintered body.

The present invention still further provides an article having a ceramic sintered body and a metal member contacted with the sintered body. The metal member contains a metal comprising one or more metal element selected from the group consisting of IVa, Va and VIa elements of the Periodic Table. The sintered body is produced by sintering a shaped body of ceramic powder contacted with the metal member and a dummy member containing a metal comprising one or more metal element selected from the group consisting of IVa, Va and VIa elements of the Periodic Table.

The inventors have studied the cause of the irregularity of temperature distribution on the heating face of the ceramic heater and reached the following discovery, which will be described below referring to FIG. 5.

FIG. 5 is a cross sectional view schematically showing a ceramic heater 15. The heater has a ceramic sintered body 4A, for example with a shape of a disk, and two layers of heat resistors 5A and 5B embedded in the sintered body, for example. 4a represents a heating face and 4b represents a back face. The heat resistors 5A and 5B are connected with the corresponding terminals 6A, 6B, 6C and 6D.

The inventors have tried to form the ceramic sintered body 4A with aluminum nitride and form the heat resistors with molybdenum to produce the ceramic heater 15. When the temperature distribution on the heating face of the heater exceeds a specified value, each position of the heat resistor is then observed at the cross section. It is thus proved that molybdenum carbide phase is generated in the heat resistor made of molybdenum and the volume ratio of the molybdenum carbide phase is substantially different among the respective observed positions of the heat generator. For example, each of the positions 13A to 13H of the heat resistor shown in FIG. 5 was observed at the cross section. As a result, substantially deviation was confirmed in the ratio of the area of molybdenum carbide phase among the observed positions.

When the ratio of molybdenum carbide is increased in the heat resistor, the resistance of the heat resistor would be larger so that the calorific power is increased. It is considered that the ratio of the carbide in the heat resistor is changed depending on the positions to increase the temperature distribution on the heating face. Measured temperature distribution on the heating face is proved to be consistent with the above theory.

The inventors have further successfully tried to reduce an amount of the metal carbide in the heat resistor so as to reduce the deviation of the amount of the carbide depending on the positions in the heat resistor and thus to reduce the temperature distribution on the heating face. The invention is based on the discoveries.

Specifically, the heat resistor contains a metal comprising one or more metal element selected from the group consisting of IVa, Va and VIa elements of the Periodic Table and a carbide of the metal. In this case, a ratio (Ic/Im) of a total (Ic) of a main peak strength of the metal carbide to a total (Im) of a main peak strength of the metal is adjusted at a value not larger than 0.2, measured by means of an X-ray diffraction method. It is thus possible to reduce the temperature distribution on the heating face and the yield of off-specification products.

The metal containing one or more metal element selected from the group consisting of IVa, Va and VIa elements of the Periodic Table is as follows.

(1) A pure metal composed of one kind of the metal element. The metal may includes a small amount of the other metal elements or impurities.

(2) An alloy containing the two or more metal elements The metal carbide is as follows.

(1) When the heat resistor is a pure metal composed of one kind of metal element, the carbide of the metal is generated.

(2) When the heat generator is an alloy of two or more metals, (a) mixture of the carbides of the metals may be generated. Alternatively, (b) a composite carbide containing the two or more metal elements may be generated.

The main peak strength (Ic) of the metal carbide measured by an X-ray diffraction measurement means the strength of a peak having the maximum strength in peaks listed in JCPDS cards corresponding with the metal carbide. A total of the main peak strength(s) is a total of the main peak strength(s) of the corresponding metal carbide(s). When the resistor is made of a pure metal, the main peak of the metal means the peak having the maximum strength in peaks listed in a JCPDS card corresponding with the metal. When the resistor is made of an alloy containing metals, the main peaks mean the respective peaks each having the maximum strength in peaks listed in a JCPDS card corresponding with each of the metals.

The inventors have further noted the change of the resistance of the heat resistor during the sintering process of the ceramic shaped body. That is, the heat resistor is embedded in a shaped body of ceramic powder and the shaped body is then sintered. As the change of the resistance of the heat resistor is large, the deviation of the amount of the carbide in the heat resistor may be larger depending on the positions. The deviation may result in considerable temperature distribution on the heating face. Specifically, the ratio of change of the resistance of the heat resistor during the sintering process of the shaped body is defined as ((Rb−Ra)/Ra), wherein Ra represents the resistance of the heat resistor before the sintering and Rb represents that of the heat resistor after the sintering. It is found that the uniformity of temperature on the heating face may be considerably improved by reducing the ratio of change of resistance to a value not larger than 30 percent. It has not been studied the relationship between the change of the resistance of the heat resistor before and after the sintering and the uniformity of temperature on the heating face.

Further, the inventors have studied the method of reducing the irregular carbide generation in the heat resistor during the sintering process. Finally the following method is found to be effective for reducing the irregular carbide generation. That is, a dummy member, which is composed of a metal containing one or more metal element(s) selected from the group consisting of elements belonging to IVa, Va and VIa groups in the Periodic Table, is contacted with the shaped body before the sintering process. The effects may be considered as follows. Excessive carbon atoms are present in the shaped body and may be reacted with metal elements constituting the heat resistor during the sintering process. Such excessive carbon atoms react with metal elements constituting the dummy member and absorbed into the dummy member during the sintering. In this embodiment, the metal member, which does not have a substantial function in the sintered body, is embedded in the ceramic shaped body for reducing the irregular carbide generation during the sintering process in the heat generator. Such attempt has not been tried till the present invention.

It was further found that the carbide generation may be reduced by applying a lower pressure at a temperature at which AlN does not decompose in the sintering process. It was further found that such low temperature sintering condition may be effectively combined with the dummy member.

Further, such idea of reducing the irregular carbide generation in the heat generator due to the absorption of excessive carbon atoms into the dummy member is applicable to the heat generator and ceramic heater, as well as the other ceramic articles having metal members. That is, when the metal member contains one or more metal element(s) selected from the group consisting of elements belonging to IVa, Va and Via groups of the Periodic Table, the dummy member may be contacted with the shaped body of ceramic powder. The dummy member is composed of a metal containing one or more metal element(s) selected from the group consisting of elements belonging to IVa, Va and VIa groups of the Periodic Table. The shaped body is then sintered to prevent irregular carbide generation in the metal member so that the yield of off-specification products may be reduced.

The dummy member means a member which does not have a specific function in a ceramic article. The dummy member may thus be removed from the sintered body during the processing of the sintering body. Alternatively, the dummy member may be left in the ceramic article. When the dummy member is left in the ceramic article, however, it is necessary to design the whole of the article considering the thermal conductivity and dimension of the dummy member. The freedom of the design is thus limited. It is therefore preferred to remove at least a part of the dummy member from the article by processing the sintered body.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 5 is a cross sectional view schematically showing a ceramic heater 15.

PREFERRED EMBODIMENTS OF THE INVENTION

One or more metal element selected from the group consisting of VIa, Va and VIa groups of the Periodic Table may preferably be the followings.

W, Mo, Hf, Nb, Ta

Ic/Im may preferably be not larger than 0.1 on the viewpoint of uniformity of temperature on the heating face.

The lower limit of Ic/Im is not particularly defined. When the carbide is not generated or scarcely generated, however, the adhesion of the metal member and ceramics at the interface may be deteriorated to result in peeling of the metal member or space along the interface. Ic/Im may preferably be not smaller than 0.001 for further improving the adhesion of the metal member to ceramics.

Further, for improving the uniformity of temperature on the heating face, the ratio of change of the resistance of heat generator due to the sintering of the shaped body ((Rb−Ra)/Ra) may more preferably be not larger than 10 percent. ((Rb−Ra)/Ra) may preferably be not smaller than minus 90 percent for improving the adhesion of the heat resistor and ceramics. Besides, ((Rb−Ra)/Ra) may be a value below zero, because the heat resistor may be oxidized or carbonated so that the initial resistance may be larger.

Figure 1:
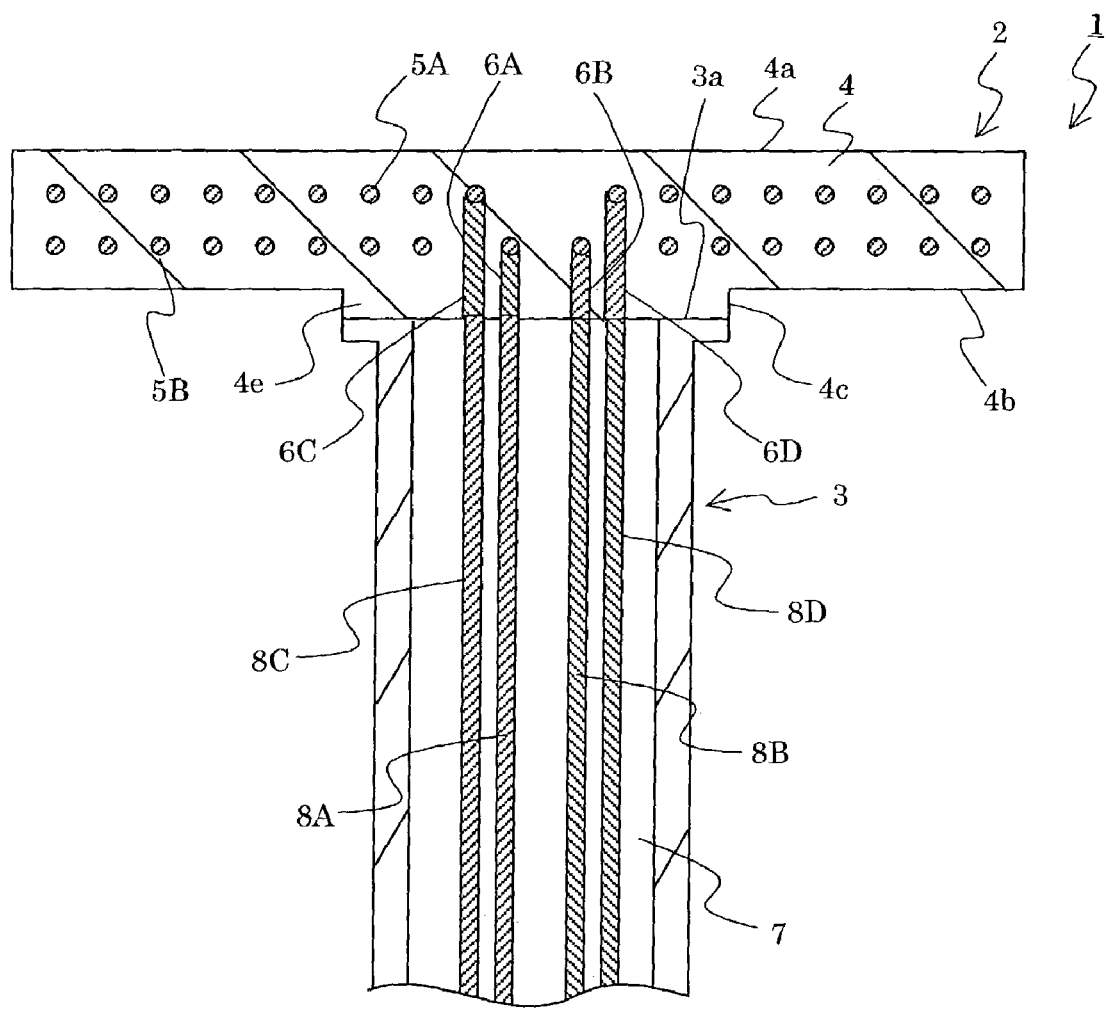
FIG. 1 is a cross sectional view schematically showing a heating system 1 having a ceramic heater 2 according to one embodiment of the present invention.
Figure 2:
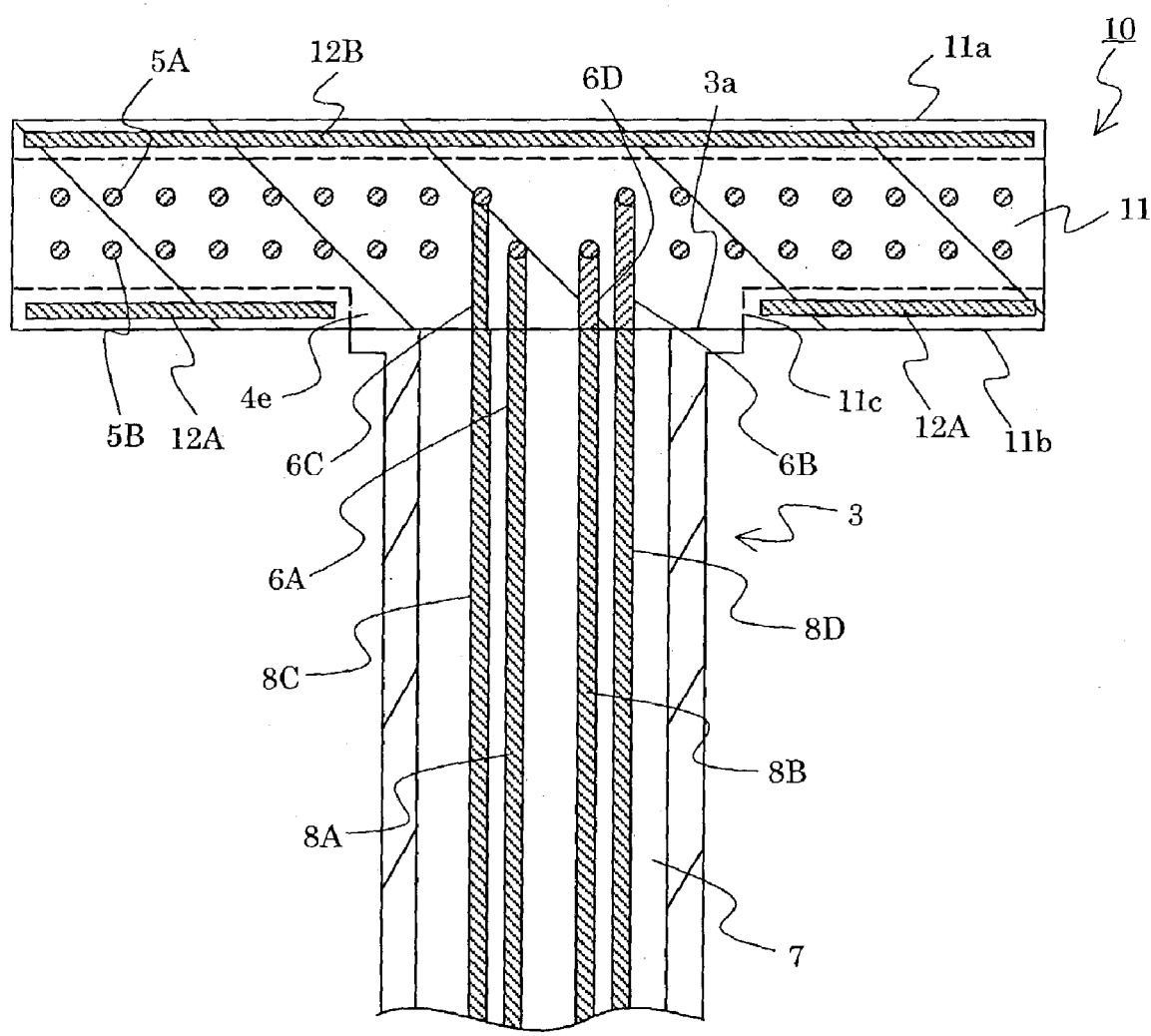
FIG. 2 is a cross sectional view schematically showing an assembly 10 for producing the ceramic heater of FIG. 1.

FIG. 1 is a cross sectional view schematically showing a heating apparatus 1 according to one embodiment of the present invention, and FIG. 2 shows an assembly 10 in a manufacturing step of the heating apparatus 1. In the present example, a heat resistor having a desired shape is embedded in a shaped body of ceramic powder. A disk-shaped dummy member 12B and ring-shaped dummy member 12A are embedded between the heat resistor and the respective main faces of the shaped body. The shaped body is then sintered to obtain a sintered body 11 shown in FIG. 2.

The sintered body in the present invention has a shape of a disk. One main face 11a of the sintered body 11 is a heating face and the other face 11b is a back face. For example two layers of heat resistors 5A and 5B are embedded in the sintered body 11. Terminals 6A, 6B, 6C and 6D are connected with the corresponding heat resistors 5A and 5B. The disk-shaped dummy member 12B is embedded between the heat resistor 5A and heating face 11a. The ring-shaped dummy member 12A is embedded between the heat resistor 5B and back face 1b. The end face 3a of the supporting member 3 is joined with the back face 11b of the sintered body 11. Electric supply members 8A to 8D are contained in the inner space of the supporting member 3. The electric supply members 8A, 8B, 8C and 8D are connected with the corresponding terminals 6A, 6B, 6C and 6D.

The sintered body 11 is then processed along dotted lines shown in FIG. 2 to remove the dummy members 12A, 12B and the surrounding parts. The sintered body shown in FIG. 1 is thus obtained. 4a, 4b, 4c and 4d are processed faces, respectively. As a result, the thickness of the sintered body 4 is made smaller than that of the sintered body 11 and a circular protrusion 4e is formed on the side of the back face 4b of the sintered body 4. The heating system 1 having the ceramic heater 2 and the supporting member 3 is thus obtained.

The supporting member and ceramic heater may be joined with each other by means of a joining method not particularly limited including soldering, fixing with bolts, or solid phase welding described in Japanese patent publication P8-73280A. The heater and supporting member may be joined and sealed using a sealing member such as an O-ring and a metal packing.

The heater according to the present invention is not limited, and may preferably for a system for producing semiconductors. Such system means a system usable in a wide variety of semiconductor processing in which metal contamination of a semiconductor is to be avoided. Such system includes a film forming, etching, cleaning and testing systems.

The sintered body for the heater may be made of a material not particularly limited. The material for the sintered body may be a known ceramic material including a nitride ceramics such as aluminum nitride, silicon nitride, boron nitride and sialon, and an alumina-silicon carbide composite material. Aluminum nitride or alumina is most preferred for providing excellent anti-corrosion property against a corrosive gas such as a halogen based corrosive gas.

The shape of the substrate is not particularly limited and may preferably be disk shaped. Pocket shaped parts, emboss-shaped parts, or grooves may be formed on the heating face.

The substrate may be produced by means of a method not particularly limited, preferably by hot pressing and hot isostatic pressing.

The supporting member may be made of a material not particularly limited. The material may be a known ceramic material including a nitride ceramics such as aluminum nitride, silicon nitride, boron nitride and sialon, and an alumina-silicon carbide composite material.

The heat resistor may have a shape of a coil, ribbon, mesh, plate or film. The shape of the dummy member is not particularly limited including a coil, ribbon, mesh, plate or film.

An element for generating a high frequency or electrostatic chuck may be embedded in the sintered body in addition to the heat resistor.

In a preferred embodiment, the ceramic sintered body contains a rare earth element in a content of not larger than 10 weight percent calculated as the oxide thereof. It is thus possible to further reduce the irregular carbide generation in the metal member during the sintering process. The rare earth element includes the following seventeen elements: samarium, scandium, yttrium, lanthanum, cerium, praseodymium, neodymium, promethium, europium, gadolinium, terbium, dysprosium, holmium, erbium, thulium, ytterbium and lutetium.

Preferably, the rare earth element is one or more element selected from the group consisting of yttrium, lanthanum, cerium, gadolinium, dysprosium, erbium and ytterbium.

The content of a rare earth element may preferably be not lower than 0.05 weight percent, and more preferably be not lower than 1 weight percent, calculated as the oxide for helping the densification of the sintered body. When the content of a rare earth element is made larger, however, an increase of the resistance during the sintering process tends to be larger. The use of the dummy member according to the present invention is more effective in this case. Further, as the content of a rare earth element is lower, an increase of the resistance during the sintering process is generally smaller. On the viewpoint, the content of a rare earth element may preferably be not larger than 0.5 weight percent calculated as the oxide.

In a preferred embodiment, the sintered body is made of aluminum nitride and the metal member is made of molybdenum, tungsten or the alloy of molybdenum and tungsten.

The shaped body may be produced according to any known methods including dry press, doctor blade, extrusion, casting, tape casting methods or the like.

In a formulating step, aluminum nitride powdery raw material may be dispersed in a solvent to add a compound of a rare earth element in a form of oxide powder or solution. The raw materials may be mixed simply by means of agitation. A mixing and granulating machine such as a pot mill, trommel, attrition mill or the like may be used when it is needed to crush aggregates contained in the raw material.

Spray dry process may be preferably used in a step of drying the mixing solvent. Alternatively, it is preferred to carry out a vacuum dry process to obtain dried powder which is then passed through a sieve to adjust the distribution of particle diameters.

In a step of shaping powder, molding with a metal mold may be applied for producing a disk-shaped body. Although the pressure during the shaping step is not particularly limited as long as the shaped body is self-standing, the pressure may preferably be not lower than 100 kgf/cm$^2$. Powdery raw materials may be filled in a die for hot pressing without carrying out the above shaping step.

The sintered body according to the present invention may be preferably be produced by hot pressing. In this embodiment, it is preferred to carry out the hot pressing at a pressure of not lower than 50 kgf/cm$^2$.

The sintering temperature is not limited and may preferably be 1700 to 2200° C., more preferably be not lower than 1750° C. or not higher than 2100° C. and most preferably be 1750 to 2050° C.

The sintering may preferably be carried out under N$_2$ atmosphere, or a reduced pressure (at a pressure of 10$^{-2}$ Torr or lower) at a temperature AlN does not decompose. Further, a temperature holding step may be provided for a time period of not longer than 10 hours between 1500 to 1700° C.

EXAMPLES (Experiment A)

The ceramic heater 15 shown in FIG. 5 was produced. The substrate was made of an aluminum nitride sintered body 4A having a diameter ϕ of 350 mm and a thickness of 25 mm. The heat resistors 5A and 5B each having a shape of a coil spring was embedded in the substrate 4A. The terminals 6A to 6D were composed of cylindrical terminals made of molybdenum, respectively. 5 weight percent of yttria powder having a mean particle diameter of 1.5 μm and a purity of 99.9 percent was added to aluminum nitride powder having a mean particle diameter of 1 μm and a purity of 99.9 percent to obtain mixed powder. The mixed powder was press molded to produce a shaped body having the heat resistor embedded therein. The shaped body was sintered by means of hot pressing at a pressure of 200 kgf/cm$^2$ and a temperature of 1800° C.

The ceramic heater 15 was joined with the supporting member 3 shown in FIG. 1. The supporting member 3 is composed of an aluminum nitride sintered body having an outer diameter ϕ of 80 mm, an inner diameter ϕ of 50 mm and a length of 250 mm. The supporting member 3 is joined with the back face 4b at the central portion of the sintered body 4A by means of solid phase welding. The electric power supply means 8A to 8D each made of a nickel rod were inserted into the inner space 7 of the supporting member and connected with the corresponding terminals. The temperature of the ceramic heater was elevated so that the average temperature on the heating face 4a was about 750° C. The temperature distribution on the heating face 4a was observed by a thermoviewer to measure a difference between the maximum and minimum temperatures on the heating face.

Five samples were produced for carrying out the above experiments. As a result, the differences between the maximum and minimum temperatures were changed in a range of 13° C. to 24° C.

The sample of the ceramic heater 15 with the difference of 18° C. was cut out to expose positions 13A to 13H of the heat resistor shown in FIG. 5. The cross section of the heat resistor was then observed at the positions 13A to 13H by means of a scanning electron microscope at a magnitude of 1000. Hot spots were observed at the positions 13A and 13B and cold spots were observed at the positions 13G and 13H. The ratio of the area of the carbide phase to that of the heat resistor exposed in the cross section was measured and the results were shown in table 1.

TABLE 1

| Positions For measurement | Ratio of area of carbide phase (%) |
|---|---|
| 13 A | 43.2 |
| 13 B | 41.5 |
| 13 C | 37.6 |
| 13 D | 38.8 |
| 13 E | 32.3 |
| 13 F | 31.2 |
| 13 G | 37.3 |
| 13 H | 34.5 |

As can be seen from the results, the temperature distribution on the heating face at each position of the heat resistor is well correlated with the ratio of the area of the carbide phase on the cross section.

(Experiment B)

The heating system 1 shown in FIG. 1 was fabricated according to the method described referring to FIGS. 1 and 2. Specifically, 5 weight percent of yttria powder having a mean particle diameter of 1.5 µm and purity of 99.9 percent was added to and mixed with aluminum nitride powder having a mean particle diameter of 1 µm and purity of 99.9 percent. The thus obtained mixed powder was pressed to obtain a shaped body. The heat resistors 5A, 5B, terminals 6A to 6D and dummy members 12A and 12B were embedded in the shaped body in this step. The heat resistor had a shape of a coil spring and made of molybdenum. Each of the terminals 6A to 6D was a cylindrical terminal made of molybdenum. The dummy member 12A was composed of a ring-shaped plate made of molybdenum having an outer diameter of 348 mm and an inner diameter of 100 mm. The dummy member 12B was composed of a circular plate having an outer diameter of 348 mm. The shaped body was sintered by hot pressing at a pressure of 200 kgf/cm² and a temperature of 1800° C. The dummy members 12A and 12B were removed from the thus obtained sintered body 11 by grinding to obtain the ceramic heater shown in FIG. 1. The heater has a diameter φ of 330 mm and a thickness of 20 mm. The back face of the heater was then joined with the supporting member 3 as described above.

Each of the resistances between the terminals of the heat resistors 5A and 5B was measured before and after the sintering process.

Further, the strength Mo of main peak (110) of molybdenum and the strength $Mo_2C$ of main peak (100) of molybdenum carbide were measured by an X-ray diffraction measurement of the heat resistor in the sintered body under the following conditions. The ratio of them was then calculated. The strength was determined by using a rotating anode type X-ray diffraction system "RINT" supplied by "Rigaku Denki" under the following condition: CuKα, 50 kV, 300 mA, and 2θ=20 to 70°.

Electric power was supplied to the ceramic heater so that the average temperature on the heating face 4a was adjusted at about 750° C. The difference of the maximum and minimum temperatures was measured by means of a thermoviewer. The above experiment was performed on four samples and the results were shown in table 2.

TABLE 2

| | | Example 1 | Example 2 | Example 3 | Example 4 |
|---|---|---|---|---|---|
| Presence of Dummy member | | Present | Present | Present | Present |
| Heat Resistor 5 A | Resistance Before Sintering (Ω) | 2.80 | 2.5 | 1.8 | 2.8 |
| | Resistance After Sintering (Ω) | 2.85 | 3.0 | 2.0 | 2.5 |
| | Ratio of Change Of resistance (%) | 1.8 | 20 | 11 | −11 |
| Heat Resistor 5 B | Resistance Before Sintering (Ω) | 2.90 | 2.4 | 1.5 | 2.9 |
| | Resistance After Sintering (Ω) | 3.0 | 2.9 | 1.7 | 2.6 |
| | Ratio of Change Of Resistance (%) | 3.4 | 21 | 13 | −10 |
| Ratio of peak Intensities Ic/Im | | 0.05 | 0.11 | 0.09 | 0.04 |
| Difference of Temperature on Heating face | | 6.5 | 14 | 10.3 | 3.4 |

As can be seen from the results, it is possible to reduce the temperature distribution and deviation on the heating face by utilizing the dummy member described above. Further, it is possible to reduce the temperature distribution on the heating face by controlling the change of the resistance before and after the sintering process and Ic/Im within the ranges of the present invention.

(Experiment C)

Two samples of the heating systems were fabricated according to the same procedure as the experiment B. The dummy members 12A and 12B were not embedded in the substrate. The resistances of the heat resistor before and after the sintering process, the ratio (Ic/Im) of the strengths of main strength peaks of molybdenum and the carbide, and the difference of maximum and minimum temperatures on the heating face were measured for each system. The results were shown in table 3.

TABLE 3

| | | Comparative Example 1 | Comparative Example 2 |
|---|---|---|---|
| Presence of dummy Member | | None | None |
| Heat Resistor 5 A | Resistance Before Sintering (Ω) | 2.8 | 1.7 |
| | Resistance After Sintering (Ω) | 3.9 | 2.5 |
| | Ratio of change of Resistance (%) | 39 | 47 |
| Heat Resistor 5 B | Resistance Before Sintering (Ω) | 2.8 | 1.6 |
| | Resistance After Sintering (Ω) | 3.9 | 2.5 |
| | Ratio of change of Resistance (%) | 39 | 56 |
| Ratio of peak Intensities Ic/Im | | 0.31 | 0.37 |
| Difference of Temperature on Heating face (° C.) | | 27 | 33 |

As can be seen from table 3, when the dummy member is not embedded in the substrate, the deviation or irregularity of the temperature on the heating face proved to be more considerable. Further, when the ratio of resistances before and after the sintering process and Ic/Im are out of the ranges defined in the present invention, the deviation or irregularity of temperature on the heating face may be further increased.

(Experiment D)

As the experiment C, three heating systems were fabricated. The content of a rare earth element calculated as the oxide was changed as shown in table 4. The resistances of the heat resistor before and after the sintering process, the ratio (Ic/Im) of the strengths of main strength peaks of molybdenum and the carbide, and the difference of maximum and minimum temperatures on the heating face were measured for each system. The results were shown in table 4.

TABLE 4

| | | Example 5 | Example 6 | Comparative example 6 |
|---|---|---|---|---|
| Content of rare earth element calculated as oxide (weight %) | | 0.01 | 5 | 15 |
| Heat Resistor 5 A | Resistance before Sintering (Ω) | 2.8 | 1.7 | 1.7 |
| | Resistance after Sintering (Ω) | 2.5 | 2.0 | 2.6 |
| | Ratio of change of Resistance (%) | −11 | 18 | 53 |
| Heat Resistor 5 B | Resistance before Sintering (Ω) | 2.9 | 1.5 | 1.8 |
| | Resistance after Sintering (Ω) | 2.6 | 1.7 | 2.9 |
| | Ratio of change Of Resistance (%) | −10 | 13 | 61 |

TABLE 4-continued

|  | Example 5 | Example 6 | Comparative example 6 |
|---|---|---|---|
| Ratio of peak intensities Ic/Im | 0.07 | 0.09 | 0.4 |
| Difference of temperature On heating face (° C.) | 3.6 | 10.5 | 38 |

As can be seen from the results, it is possible to reduce the temperature distribution and deviation on the heating face by controlling the change of the resistances before and after the sintering process and Ic/Im within the ranges of the present invention.

Figure 3:
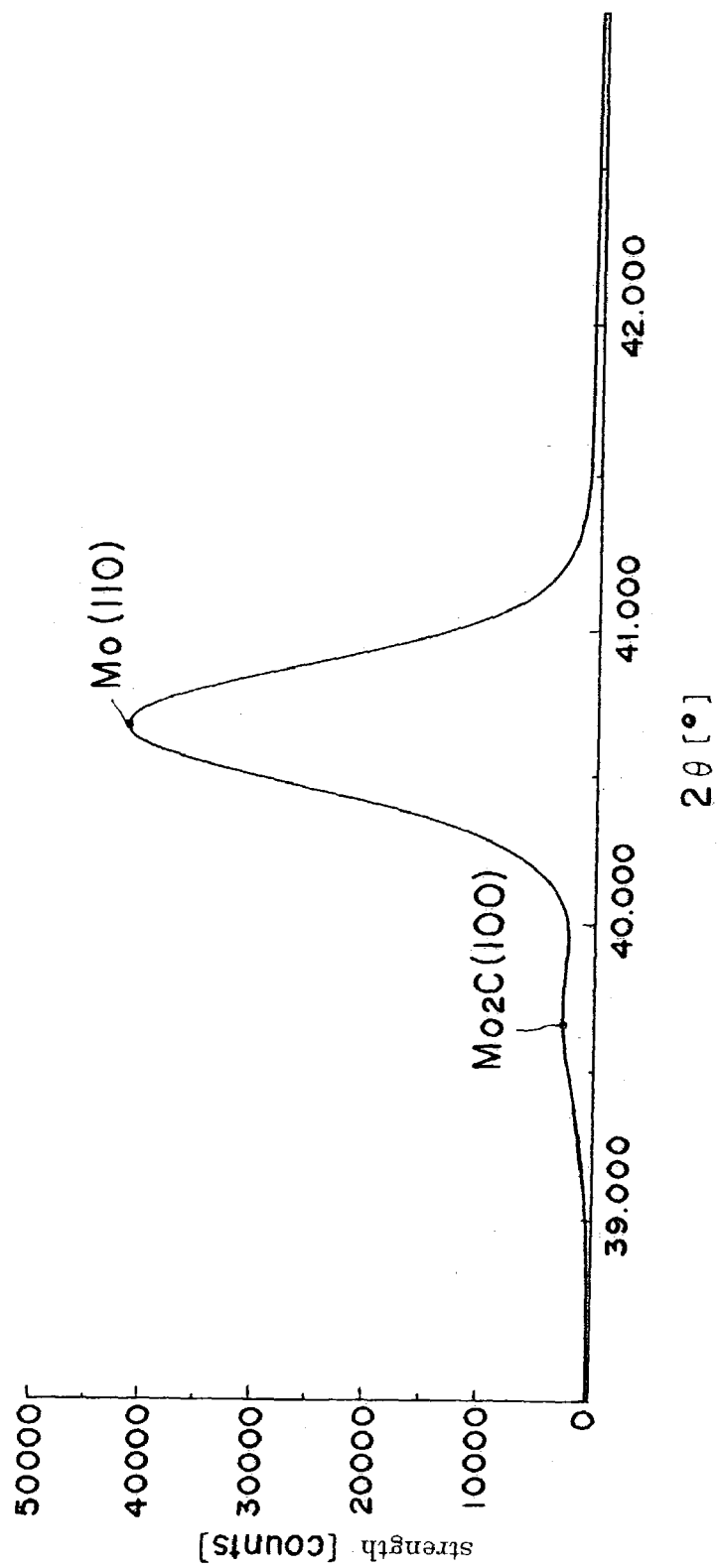
FIG. 3 is an X-ray diffraction chart of a heat resistor in an sample of an example 6.
Figure 4:
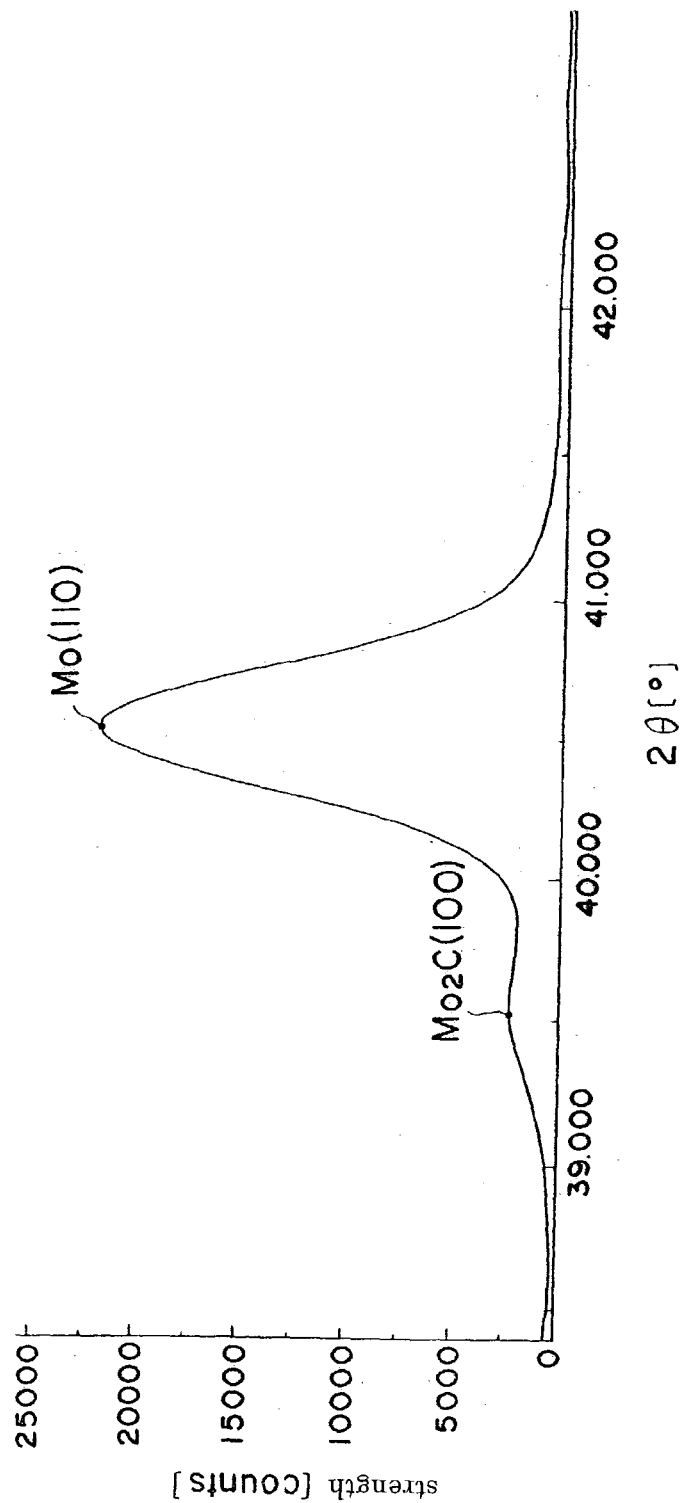
FIG. 4 is an X-ray diffraction chart of a heat resistor in a sample of an example 2.

FIG. 3 is an X-ray diffraction chart of the heat resistor of the sample according to the inventive example 6, and FIG. 4 is an X-ray diffraction chart of the heat resistor of the sample according to the inventive example 2.

Further, when the heat resistor is made of an alloy of molybdenum and tungsten, the results substantially same as the above were obtained.

As described above, the present invention provides a ceramic heater having a ceramic sintered body and a heat resistor contacted with the sintered body in which the change of the uniformity of temperature on the heating face may be reduced among heaters actually fabricated.

The present invention further provides an article having a ceramic sintered body and a metal member contacted with the sintered body, in which a reaction of the metal member is prevented or a degree of the progress of a reaction of the member is made constant during the sintering process.

The present invention has been explained referring to the preferred embodiments. However, the present invention is not limited to the illustrated embodiments which are given by way of examples only, and may be carried out in various modes without departing from the scope of the invention.

The invention claimed is:

1. A ceramic heater comprising a ceramic sintered body and a heat resistor in contact with said sintered body;
   wherein said heat resistor contains a metal comprising one or more metal elements selected from the group consisting of Group IVa, Group Va and Group VIa elements of the Periodic Table and a carbide of said metal;
   wherein a ratio (Ic/Im) of a total (Ic) of a main peak strength of said metal carbide to a total (Im) of a main peak strength of said metal is not larger than 0.2, measured by means of X-ray diffraction; and
   wherein said sintered body is produced by sintering a shaped body of ceramic powder in contact with said heat resistor and a dummy member composed of a metal comprising one or more metal elements selected from the group consisting of Group IVa, Group Va and Group VIa elements of the Periodic Table, wherein said dummy member is not connected to a power source such that said dummy member is electrically neutral and wherein said dummy member is not operative when said ceramic heater is operated, and wherein said dummy member is electrically isolated from said heat resistor.

2. The ceramic heater of claim 1, wherein said ratio (Ic/Im) is not smaller than 0.001.

3. The ceramic heater of claim 1, wherein said sintered body is produced by sintering a shaped body of ceramic powder in contact with said heat resistor, wherein a ratio (Rb−Ra)/Ra is not larger than 30 percent, where "Ra" is a resistance of said heat resistor before sintering and "Rb" is a resistance of said heat resistor after sintering.

4. The ceramic heater of claim 1, wherein said sintered body contains a rare earth element in an amount of not larger than 10 weight percent calculated as a rare earth oxide.

5. The ceramic heater of claim 1, wherein said heat resistor is embedded in said sintered body.

6. A method of producing a ceramic heater comprising a ceramic sintered body and a heat resistor in contact with said sintered body, said method comprising the steps of:
   contacting a shaped body of ceramic powder with said heat resistor and a dummy member containing a metal comprising one or more metal elements selected from the group consisting of Group IVa, Group Va and Group VIa elements of the Periodic Table, wherein said dummy member is not connected to a power source such that said dummy member is electrically neutral and wherein said dummy member is not operative when said ceramic heater is operated and wherein said dummy member is electrically isolated from said heat resistor; and
   sintering said shaped body to provide said sintered body;
   wherein said heat resistor contains a metal comprising one or more metal elements selected from the group consisting of Group IVa, Group Va and Group VIa elements of the Periodic Table and a carbide of said metal, and wherein a ratio (Ic/Im) of a total (Ic) of a main peak strength of said metal carbide to a total (Im) of a main peak strength of said metal is not larger than 0.2, measured by means of X-ray diffraction.

7. The method of claim 6, wherein a ratio (Rb−Ra)/Ra is not larger than 30 percent, where "Ra" is a resistance of said heat resistor before said sintering step and "Rb" is a resistance of said heat resistor after said sintering step.

8. A method of producing a ceramic heater comprising sing a ceramic sintered body and a heat resistor in contact with said sintered body, said method comprising the steps of:
   contacting a shaped body of ceramic powder with said heat resistor and a dummy member containing a metal comprising one or more metal elements selected from the group consisting of Group IVa, Group Va and Group VIa elements of the Periodic Table, wherein said dummy member is not connected to a power source such that said dummy member is electrically neutral and wherein said dummy member is not operative when said ceramic heater is operated and wherein said dummy member is electrically isolated from said heat resistor;
   sintering said shaped body to provide said sintered body; and
   removing said dummy member from said sintered body.

9. The method of claim 8, wherein said heat resistor is embedded in said shaped body.

10. An article comprising a ceramic sintered body and a metal member in contact with said sintered body:
    wherein said sintered body is produced by sintering a shaped body of ceramic powder in contact with said metal member and a dummy member containing a metal comprising one or more metal elements selected from the group consisting of Group IVa, Group Va and Group VIa elements of the Periodic Table, wherein said dummy member is not connected to a power source such that said dummy member is electrically neutral and wherein said dummy member is electrically isolated from said metal member; and
    wherein said metal member contains a metal comprising one or more metal elements selected from the group consisting of Group IVa, Group Va and Group VIa elements of the Periodic Table and a carbide of said metal, and wherein a ratio (Ic/Im) of a total (Ic) of a main peak strength of said metal carbide to a total (Im) of a main peak strength of said metal is not larger than 0.2, measured by X-ray diffraction.

11. The article of claim 10, wherein said sintered body contains a rare earth element in an amount of not larger than 10 weight percent calculated as a rare earth oxide.

12. The article of claim 10, wherein said metal member is embedded in said sintered body.

13. A method of producing a ceramic heater comprising a ceramic sintered body and a heat resistor in contact with said sintered body, said method comprising the steps of:

contacting a shaped body of ceramic powder with said heat resistor and a dummy member containing a metal comprising one or more metal elements selected from the group consisting of Group IVa, Group Va and Group VIa elements of the Periodic Table, said dummy member being electrically isolated from said heat resistor;

sintering said shaped body to provide said sintered body; and removing said dummy member from said sintered body.

14. A method of producing a ceramic heater comprising a ceramic sintered body and a heat resistor in contact with said sintered body, said method comprising the steps of:

contacting a shaped body of ceramic powder with said heat resistor and a dummy member containing a metal comprising one or more metal elements selected from the group consisting of Group IVa, Group Va and Group VIa elements of the Periodic Table, said dummy member being electrically neutral and electrically isolated from said heat resistor;

sintering said shaped body to provide said sintered body; and removing said dummy member from said sintered body.

* * * * *